United States Patent
Liu

(10) Patent No.: US 11,793,013 B2
(45) Date of Patent: Oct. 17, 2023

(54) FLEXIBLE DISPLAY PANEL AND FABRICATING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Jing Liu, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 574 days.

(21) Appl. No.: 16/959,158

(22) PCT Filed: Jun. 12, 2020

(86) PCT No.: PCT/CN2020/095848
§ 371 (c)(1),
(2) Date: Jun. 30, 2020

(87) PCT Pub. No.: WO2021/217802
PCT Pub. Date: Nov. 4, 2021

(65) Prior Publication Data
US 2023/0117160 A1 Apr. 20, 2023

(30) Foreign Application Priority Data
Apr. 27, 2020 (CN) .......................... 202010343868.7

(51) Int. Cl.
*H10K 50/80* (2023.01)
*H10K 71/00* (2023.01)
(Continued)

(52) U.S. Cl.
CPC ............. *H10K 50/80* (2023.02); *H10K 71/00* (2023.02); *H10K 77/111* (2023.02); *H10K 59/12* (2023.02);
(Continued)

(58) Field of Classification Search
None
See application file for complete search history.

(56) References Cited

U.S. PATENT DOCUMENTS 7,851,800 B2 * 12/2010 Hu ..................... H10K 59/1213
438/149
10,826,025 B2 * 11/2020 Kim ....................... H10K 59/12
(Continued)

FOREIGN PATENT DOCUMENTS

| CN | 107851551 A | 3/2018 |
| CN | 110429177 A | 11/2019 |
| CN | 110473965 A | 11/2019 |

OTHER PUBLICATIONS

English translation of ISR for PCT/CN2020/095848 (Year: 2020).*
(Continued)

*Primary Examiner* — J. E. Schoenholtz
(74) *Attorney, Agent, or Firm* — PV IP PC; Wei Te Chung; Zhigang Ma

(57) ABSTRACT

A flexible display panel and a fabricating method thereof are described. The fabricating method has steps of: providing a substrate comprising a hard state and a soft state; forming a thin-film transistor layer on a side of the substrate in the hard state; forming an organic light-emitting layer on a side of the thin-film transistor layer away from the substrate; forming an encapsulation layer on a side of the organic light-emitting layer away from the thin-film transistor; wherein, after laying of each film layer in the flexible display panel, a photoinitiator layer is formed on a side of the substrate away from the thin-film transistor layer, and the substrate and the (Continued)

photoinitiator layer are irradiated with the preset ultraviolet light to change the substrate from the hard state to the soft state to obtain the flexible display panel. The fabricating method avoids problems caused by using laser lift-off technology.

13 Claims, 2 Drawing Sheets

(51) Int. Cl.
*H10K 77/10* (2023.01)
*H10K 59/12* (2023.01)
*H10K 102/00* (2023.01)

(52) U.S. Cl.
CPC .... *H10K 59/1201* (2023.02); *H10K 2102/311* (2023.02)

(56) References Cited

U.S. PATENT DOCUMENTS

| | | | |
|---|---|---|---|
| 10,854,828 B2 * | 12/2020 | Furuie | H10K 50/818 |
| 11,380,739 B2 * | 7/2022 | Seo | H10K 50/844 |
| 2014/0323006 A1 | 10/2014 | Song | |

OTHER PUBLICATIONS

International Search Report in International application No. PCT/CN2020/095848, dated Jan. 27, 2021.
Written Opinion of the International Search Authority in International application No. PCT/CN2020/095848, dated Jan. 27, 2021.

* cited by examiner

FLEXIBLE DISPLAY PANEL AND FABRICATING METHOD THEREOF

FIELD OF DISCLOSURE

The present disclosure relates to displays, and more particularly to a flexible display panel and a fabricating method thereof.

BACKGROUND OF DISCLOSURE

According to the current manufacturing method of flexible OLED (organic light emitting diode) in the industry, before a thin-film transistor (TFT) structure is fabricated, a polyimide (PI) layer is coated on a glass substrate. In a subsequent process, the glass substrate is removed by laser lift-off (LLO) technology to form an OLED panel with a PI layer as a flexible substrate. However, in the LLO process, due to a high laser energy, it is easy to cause damage to the flexible printed circuit board protruding from a boundary of the panel. In addition, cost of laser equipment is also very high, so it will increase production and research and development costs.

Therefore, it is necessary to provide a flexible display panel and a fabricating method thereof to solve problems in the prior art.

SUMMARY OF DISCLOSURE

From above, the present disclosure provides a flexible display panel and a fabricating method thereof to solve problems caused by using the laser lift-off (LLO) technology in the prior art.

An object of the present disclosure is to provide a flexible display panel and a fabricating method thereof, which uses a substrate in a hard state and a photoinitiator layer to react with ultraviolet light to form a flexible display panel, so as to avoid problems caused by use of laser lift-off (LLO) technology.

To achieve the above object of the present disclosure, an embodiment of the present disclosure provides a flexible display panel comprising: a substrate comprising a hard state and a soft state, wherein the substrate can be transformed from the hard state to the soft state by irradiation with a preset ultraviolet light, wherein material of the substrate includes at least one of polyolefins and polyacrylates; a thin-film transistor layer disposed on a side of the substrate in the hard state; an organic light-emitting layer disposed on a side of the thin-film transistor layer away from the substrate; an encapsulation layer disposed on a side of the organic light-emitting layer away from the thin-film transistor; and wherein, after laying of each film layer in the flexible display panel, a photoinitiator layer is disposed on a side of the substrate away from the thin-film transistor layer, and the substrate and the photoinitiator layer are irradiated with the preset ultraviolet light to change the substrate from the hard state to the soft state to obtain the flexible display panel, wherein material of the photoinitiator layer includes at least one of esters and ketones.

In an embodiment of the present disclosure, material of the substrate comprises at least one of polystyrene and polyacrylate.

In an embodiment of the present disclosure, material of the photoinitiator layer comprises at least one of methyl benzoylformate and diphenylethanedione.

To achieve the above object of the present disclosure, an embodiment of the present disclosure provides a flexible display panel comprising: a substrate comprising a hard state and a soft state, wherein the substrate can be transformed from the hard state to the soft state by irradiation with a preset ultraviolet light; a thin-film transistor layer disposed on a side of the substrate in the hard state; an organic light-emitting layer disposed on a side of the thin-film transistor layer away from the substrate; an encapsulation layer disposed on a side of the organic light-emitting layer away from the thin-film transistor; and wherein, after laying of each film layer in the flexible display panel, a photoinitiator layer is disposed on a side of the substrate away from the thin-film transistor layer, and the substrate and the photoinitiator layer are irradiated with the preset ultraviolet light to change the substrate from the hard state to the soft state to obtain the flexible display panel.

In an embodiment of the present disclosure, material of the substrate includes at least one of polyalkenes and polyacrylates.

In an embodiment of the present disclosure, material of the substrate comprises at least one of polystyrene and polyacrylate.

In an embodiment of the present disclosure, material of the photoinitiator layer includes at least one of esters and ketones.

In an embodiment of the present disclosure, material of the photoinitiator layer comprises at least one of methyl benzoylformate and diphenylethanedione.

To achieve the above object of the present disclosure, an embodiment of the present disclosure provides A fabricating method of a flexible display panel comprising steps of: providing a substrate comprising a hard state and a soft state, wherein the substrate can be transformed from the hard state to the soft state by irradiation with a preset ultraviolet light; forming a thin-film transistor layer on a side of the substrate in the hard state; forming an organic light-emitting layer on a side of the thin-film transistor layer away from the substrate; forming an encapsulation layer on a side of the organic light-emitting layer away from the thin-film transistor; and wherein, after laying of each film layer in the flexible display panel, a photoinitiator layer is formed on a side of the substrate away from the thin-film transistor layer, and the substrate and the photoinitiator layer are irradiated with the preset ultraviolet light to change the substrate from the hard state to the soft state to obtain the flexible display panel.

In an embodiment of the present disclosure, material of the substrate includes at least one of polyalkenes and polyacrylates.

In an embodiment of the present disclosure, material of the substrate comprises at least one of polystyrene and polyacrylate.

In an embodiment of the present disclosure, material of the photoinitiator layer includes at least one of esters and ketones.

In an embodiment of the present disclosure, material of the photoinitiator layer comprises at least one of methyl benzoylformate and diphenylethanedione.

Compared with existing technology, the flexible display panel and the fabricating method thereof of the present disclosure can form a substrate in a soft state by using a substrate in a hard state and a photoinitiator layer to react with ultraviolet light to avoid the problems caused by using the laser lift-off technique.

In order to make the above contents of the present disclosure more obvious and understandable, the preferred

DETAILED DESCRIPTION OF PREFERRED EMBODIMENTS

Figure 1:
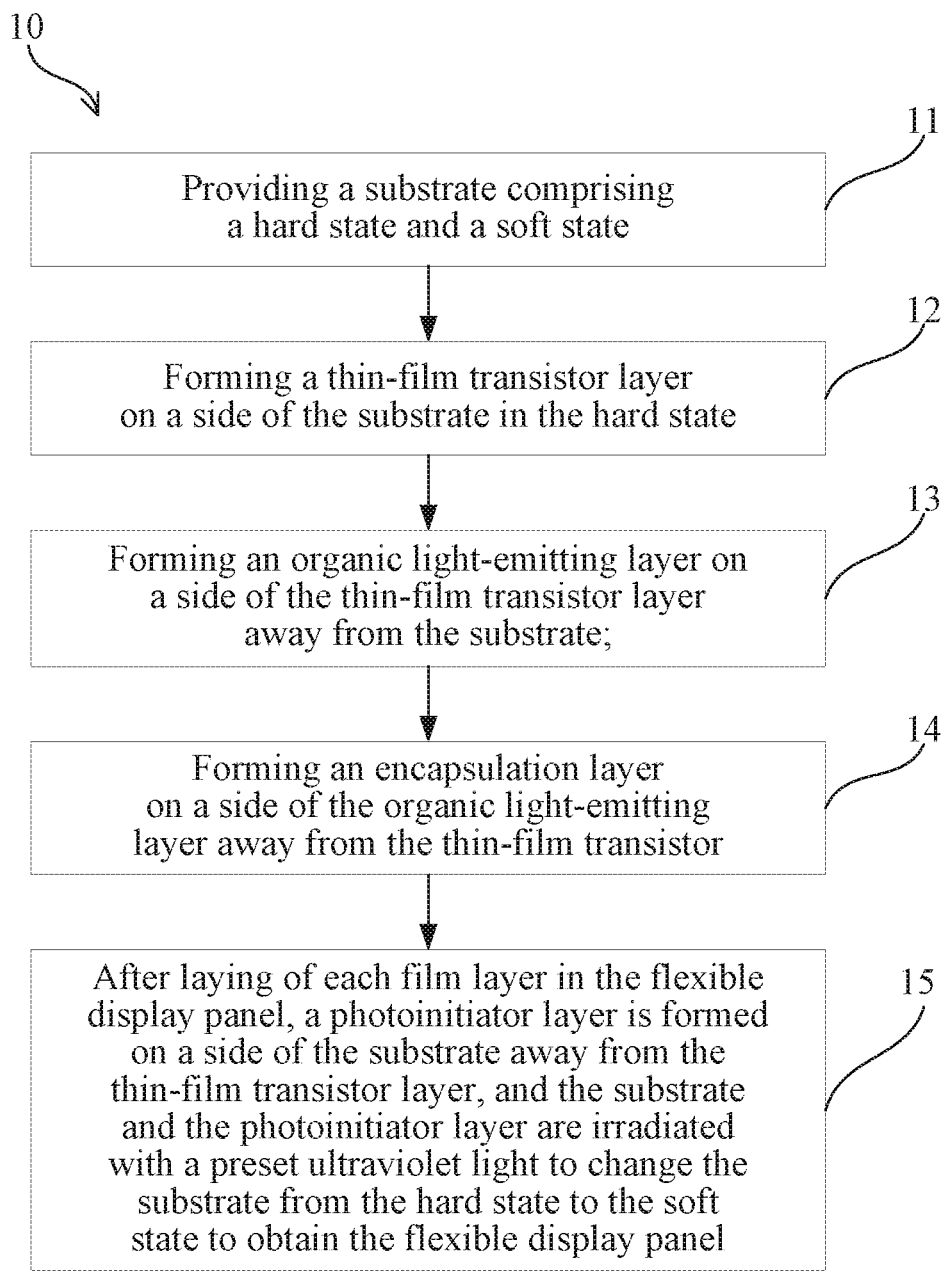
FIG. 1 is a schematic flowchart of a fabricating method of a flexible display panel according to an embodiment of the disclosure.

The following describes the preferred embodiments of the present disclosure in detail in conjunction with the accompanying drawings of the specification to fully introduce the technical content of the present disclosure to those skilled in the art, to exemplify that the present disclosure can be implemented, and to make the technical content disclosed by the present disclosure more clear, and to make it easier for those skilled in the art to understand how to implement the present disclosure. However, the present disclosure can be embodied by many different forms of embodiments. The protection scope of the present disclosure is not limited to the embodiments mentioned in the text. The description of the embodiments below is not intended to limit the scope of the present disclosure.

Directional terms mentioned in the present disclosure, such as "up", "down", "front", "rear", "left", "right", "inner", "outer", "side", etc. The directions in the figures and the direction words used herein are used to explain and describe the present disclosure, rather than to limit the protection scope of the present disclosure.

In the drawings, components with the same structure are denoted by same numerals, and components with similar structures or functions are denoted by similar numerals. In addition, for ease of understanding and description, the size and thickness of each component shown in the drawings are arbitrarily shown, and the present disclosure does not limit size and thickness of each component.

When certain components are described as "on" another component, the component may be directly placed on the another component. There may also be an intermediate component, which is placed on the intermediate component, and the intermediate component is placed on another component.

Referring to FIG. 1, in an embodiment of the present disclosure, a fabricating method 10 of a flexible display panel comprises steps 11 to 15 of: providing a substrate comprising a hard state and a soft state, wherein the substrate can be transformed from the hard state to the soft state by irradiation with a preset ultraviolet light (step 11); forming a thin-film transistor layer on a side of the substrate in the hard state (step 12); forming an organic light-emitting layer on a side of the thin-film transistor layer away from the substrate (step 13); forming an encapsulation layer on a side of the organic light-emitting layer away from the thin-film transistor (step 14); and wherein, after laying of each film layer in the flexible display panel, a photoinitiator layer is formed on a side of the substrate away from the thin-film transistor layer, and the substrate and the photoinitiator layer are irradiated with the preset ultraviolet light to change the substrate from the hard state to the soft state to obtain the flexible display panel (step 15).

In an embodiment of the present disclosure, a fabricating method 10 of a flexible display panel comprises step 11 of: providing a substrate comprising a hard state and a soft state, wherein the substrate can be transformed from the hard state to the soft state by irradiation with a preset ultraviolet light. In the step 11, material of the substrate includes, for example, at least one of polyalkenes and polyacrylates. In one example, material of the polyalkenes includes polystyrene. In one example, the material of the polyacrylates includes polyacrylate. It should be mentioned that the material of the substrate is in a hard state before being irradiated by the preset ultraviolet light, so as to form each film layer on the substrate.

In an embodiment of the present disclosure, a fabricating method 10 of a flexible display panel comprises step 12 of: forming a thin-film transistor layer on a side of the substrate in the hard state. In the step 12, for materials and fabricating methods of the thin film transistor layer, reference may be made to common materials or fabricating methods in general semiconductor processes.

In an embodiment of the present disclosure, a fabricating method 10 of a flexible display panel comprises step 13 of: forming an organic light-emitting layer on a side of the thin-film transistor layer away from the substrate. In the step 13, for materials and fabricating methods of the organic light-emitting layer, reference may be made to common materials or fabricating methods in general semiconductor processes.

In an embodiment of the present disclosure, a fabricating method 10 of a flexible display panel comprises step 14 of: forming an encapsulation layer on a side of the organic light-emitting layer away from the thin-film transistor. In the step 14, for materials and fabricating methods of the encapsulation layer, reference may be made to common materials or fabricating methods in general semiconductor processes.

In an embodiment of the present disclosure, a fabricating method 10 of a flexible display panel comprises step 15 of: after laying of each film layer in the flexible display panel, a photoinitiator layer is formed on a side of the substrate away from the thin-film transistor layer, and the substrate and the photoinitiator layer are irradiated with the preset ultraviolet light to change the substrate from the hard state to the soft state to obtain the flexible display panel. In the step 15, the photoinitiator layer may be formed on the side of the substrate away from the thin film transistor layer, for example, by deposition or coating. In one embodiment, the material of the photoinitiator layer includes at least one of esters and ketones. In one example, the esters include methyl benzoylformate. In one example, the ketones include diphenylethanedione. In another embodiment, a weight ratio of the photoinitiator layer to the substrate is, for example, between 1:5 and 1:20. In an example, the weight ratio of the photoinitiator layer to the substrate is, for example, 1:7, 1:10, 1:13, 1:15, or 1:18. In an embodiment, if the weight ratio of the photoinitiator layer to the substrate is higher than 1:5 (for example, 1:4), the substrate may be excessively softened in subsequent steps. If the weight ratio of the photoinitiator layer to the substrate is less than 1:20 (for example, 1:25), the substrate may not be able to transition from the hard state to the soft state in subsequent steps.

On the other hand, in an embodiment, the preset ultraviolet light energy is between 4000 and 6000 $mj/cm^2$. It should be mentioned that if the preset ultraviolet light energy is lower than 4000 $mj/cm^2$, the substrate cannot be changed from the hard state to the soft state. If the preset ultraviolet light energy is higher than 6000 $mj/cm^2$, the substrate will be excessively softened and cannot be used as a flexible substrate. In an example, the preset ultraviolet light energy is 4500, 5000, or 5500 mj/cm$^2$, for example.

It is worth mentioning that the fabricating method of the flexible display panel according to an embodiment of the present disclosure is mainly to convert a hard substrate in a high polymerization state to a soft substrate in a low polymerization state, so that the substrate has a process from the hard state to the soft state. From above, a polymerization degree in the high polymerization state is relative to a polymerization degree in the low polymerization state, and as long as material of the substrate is in a hard state, the polymerization degree can be referred to as a high polymerization state. Conversely, material of the substrate is a polymer in a soft state, and its polymerization degree can be referred to as a low polymerization state. From above, the flexible display panel of the present disclosure replaces the existing glass substrate and PI layer by using a hard substrate and a photoinitiator layer. In addition, the substrate in the hard state and the photoinitiator layer undergo ultraviolet light reaction to form the substrate in the soft state, so as to avoid the problems caused by using the laser lift-off (LLO) technology.

Figure 2:
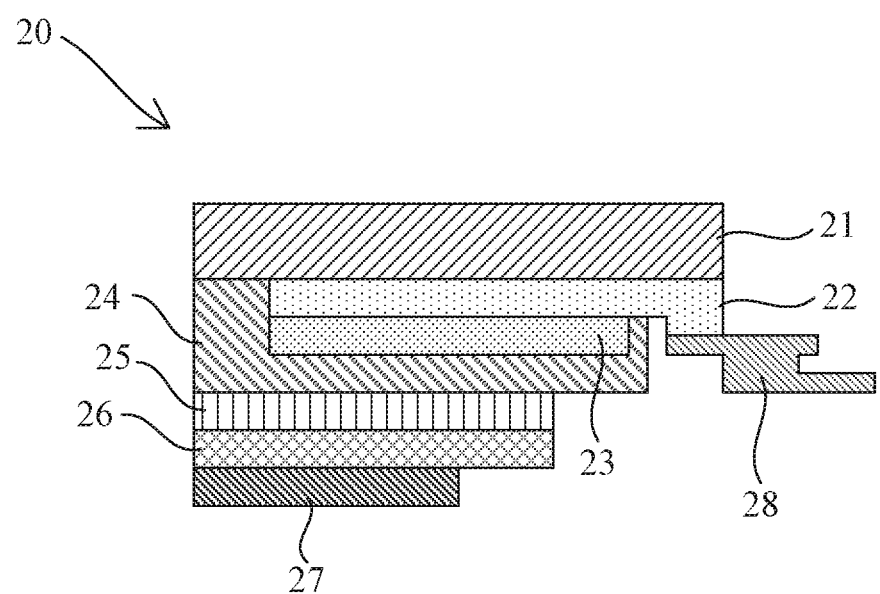
FIG. 2 is a schematic cross-sectional view of a flexible display panel according to an embodiment of the disclosure.

Referring to FIG. 2, the present disclosure further provides a flexible display panel 20 including a substrate 21, a thin-film transistor layer 22, an organic light-emitting layer 23, and an encapsulation layer 24. The substrate 21 comprises a hard state and a soft state. The substrate 21 can be transformed from the hard state to the soft state by irradiation with a preset ultraviolet light. The thin-film transistor layer 22 is disposed on a side of the substrate 21 in the hard state. The organic light-emitting layer 23 is disposed on a side of the thin-film transistor layer 22 away from the substrate 21. The encapsulation layer 24 is disposed on a side of the organic light-emitting layer 23 away from the thin-film transistor 22. After laying of each film layer in the flexible display panel 20, a photoinitiator layer (not shown) is disposed on a side of the substrate 21 away from the thin-film transistor layer 22, and the substrate 21 and the photoinitiator layer are irradiated with the preset ultraviolet light to change the substrate 21 from the hard state to the soft state to obtain the flexible display panel 20.

In an embodiment, material of the substrate 11 includes, for example, at least one of polyalkenes and polyacrylates. In one example, material of the polyolefin includes polystyrene. In one example, material of the polyacrylate resin includes polyacrylate. In one embodiment, material of the photoinitiator layer includes at least one of esters and ketones. In one example, the esters include methyl benzoylformate. In one example, the ketones include diphenylethanedione. In one embodiment, the flexible display panel 20 can be made by the fabricating method 10 of a flexible display panel as in any of the above embodiments.

In an embodiment, the flexible display panel 20 can include, for example, various layered structures and members. For example, the flexible display panel 20 can further include an optical glue 25, a touch panel 26, a polarizer 27, or a flexible printed circuit board 28. In one embodiment, for example, the substrate 21 in a hard state may be provided first, and the layered structure (e.g. the thin-film transistor layer 22, the organic light emitting layer 23 (e.g. OLED), the encapsulation layer 24, the optical glue 25, the touch panel 26, the polarizer 27) and members (such as the flexible printed circuit board 28) are formed on a surface of the substrate 21. Then, a photoinitiator layer is formed on a side of the substrate away from the thin-film transistor layer, and the substrate and the photoinitiator layer are irradiated with the preset ultraviolet light to change the substrate from the hard state to the soft state to obtain the flexible display panel. From above, the fabricating method of the flexible display panel of the present disclosure can exclude the step of removing a hard substrate (such as at least one of a glass substrate and a hard plastic substrate) by laser lift-off, thereby avoiding the problems caused by the use of laser lift-off (LLO) technology.

The present disclosure has been described by the above-mentioned related embodiments, but the above-mentioned embodiments are only examples for implementing the present disclosure. It must be pointed out that the disclosed embodiments do not limit the scope of the present disclosure. On the contrary, modifications and equivalent arrangements included in the spirit and scope of the claims are all included in the scope of the present disclosure.

The invention claimed is:

1. A flexible display panel, comprising:
    a substrate comprising a hard state and a soft state, wherein the substrate can be transformed from the hard state to the soft state by irradiation with a preset ultraviolet light, wherein material of the substrate includes at least one of polyolefins and polyacrylates;
    a thin-film transistor layer disposed on a side of the substrate in the hard state;
    an organic light-emitting layer disposed on a side of the thin-film transistor layer away from the substrate;
    an encapsulation layer disposed on a side of the organic light-emitting layer away from the thin-film transistor; and
    wherein, after laying of each film layer in the flexible display panel, a photoinitiator layer is disposed on a side of the substrate away from the thin-film transistor layer, and the substrate and the photoinitiator layer are irradiated with the preset ultraviolet light to change the substrate from the hard state to the soft state to obtain the flexible display panel, wherein material of the photoinitiator layer includes at least one of esters and ketones.

2. The flexible display panel according to claim 1, wherein material of the substrate comprises at least one of polystyrene and polyacrylate.

3. The flexible display panel according to claim 1, wherein material of the photoinitiator layer comprises at least one of methyl benzoylformate and diphenylethanedione.

4. A flexible display panel, comprising:
    a substrate comprising a hard state and a soft state, wherein the substrate can be transformed from the hard state to the soft state by irradiation with a preset ultraviolet light;
    a thin-film transistor layer disposed on a side of the substrate in the hard state;
    an organic light-emitting layer disposed on a side of the thin-film transistor layer away from the substrate;
    an encapsulation layer disposed on a side of the organic light-emitting layer away from the thin-film transistor; and
    wherein, after laying of each film layer in the flexible display panel, a photoinitiator layer is disposed on a side of the substrate away from the thin-film transistor layer, and the substrate and the photoinitiator layer are irradiated with the preset ultraviolet light to change the substrate from the hard state to the soft state to obtain the flexible display panel.

5. The flexible display panel according to claim 4, wherein material of the substrate includes at least one of polyalkenes and polyacrylates.

6. The flexible display panel according to claim 5, wherein material of the substrate comprises at least one of polystyrene and polyacrylate.

7. The flexible display panel according to claim 4, wherein material of the photoinitiator layer includes at least one of esters and ketones.

8. The flexible display panel according to claim 7, wherein material of the photoinitiator layer comprises at least one of methyl benzoylformate and diphenylethanedione.

9. A fabricating method of a flexible display panel, comprising steps of:
   providing a substrate comprising a hard state and a soft state, wherein the substrate can be transformed from the hard state to the soft state by irradiation with a preset ultraviolet light;
   forming a thin-film transistor layer on a side of the substrate in the hard state;
   forming an organic light-emitting layer on a side of the thin-film transistor layer away from the substrate;
   forming an encapsulation layer on a side of the organic light-emitting layer away from the thin-film transistor; and
   wherein, after laying of each film layer in the flexible display panel, a photoinitiator layer is formed on a side of the substrate away from the thin-film transistor layer, and the substrate and the photoinitiator layer are irradiated with the preset ultraviolet light to change the substrate from the hard state to the soft state to obtain the flexible display panel.

10. The fabricating method of the flexible display panel according to claim 9, wherein material of the substrate includes at least one of polyalkenes and polyacrylates.

11. The fabricating method of the flexible display panel according to claim 10, wherein material of the substrate comprises at least one of polystyrene and polyacrylate.

12. The fabricating method of the flexible display panel according to claim 9, wherein material of the photoinitiator layer includes at least one of esters and ketones.

13. The fabricating method of the flexible display panel according to claim 12, wherein material of the photoinitiator layer comprises at least one of methyl benzoylformate and diphenylethanedione.

* * * * *